United States Patent
Singh et al.

(10) Patent No.: US 7,224,168 B2
(45) Date of Patent: May 29, 2007

(54) METHOD AND APPARATUS FOR AUTOMATIC DETERMINATION OF LEAD-ACID BATTERY SPECIFIC GRAVITY

(75) Inventors: Harmohan N. Singh, Rockaway, NJ (US); Steven Hoenig, Staten Island, NY (US); Thirumalai G. Palanisamy, Morristown, NJ (US); Hector M. Atehortua, North Bergen, NJ (US)

(73) Assignee: Honeywell International, Inc., Morristown, NJ (US)

( * ) Notice: Subject to any disclaimer, the term of this patent is extended or adjusted under 35 U.S.C. 154(b) by 406 days.

(21) Appl. No.: 10/860,315

(22) Filed: Jun. 4, 2004

(65) Prior Publication Data

US 2005/0270033 A1 Dec. 8, 2005

(51) Int. Cl.
*G01N 27/416* (2006.01)

(52) U.S. Cl. ................................. 324/432; 324/426

(58) Field of Classification Search ............... 320/132; 324/426–433, 439, 440
See application file for complete search history.

(56) References Cited

U.S. PATENT DOCUMENTS 4,626,765 A * 12/1986 Tanaka ...................... 320/127
5,049,803 A 9/1991 Palanisamy
5,381,096 A 1/1995 Hirzel
6,441,619 B1 * 8/2002 Araki et al. .............. 324/427
2001/0035740 A1 11/2001 Palanisamy

FOREIGN PATENT DOCUMENTS

JP 2103870 4/1990

* cited by examiner

Primary Examiner—Adolf Deneke Berhane
Assistant Examiner—Richard V. Muralidar
(74) Attorney, Agent, or Firm—Oral Caglar, Esq.

(57) ABSTRACT

In accordance with various embodiments, there is a method for determining the specific gravity of a battery. Various embodiments include the steps of applying an increasing current ramp to a battery and measuring a response voltage of the battery when the increasing current ramp is applied to the battery. When the current ramp reaches a predetermined current a decreasing current is supplied to the battery and the battery's voltage response is measured. The specific gravity of the battery can be determined based on the voltage response of the battery to the applied current ramp.

22 Claims, 3 Drawing Sheets

METHOD AND APPARATUS FOR AUTOMATIC DETERMINATION OF LEAD-ACID BATTERY SPECIFIC GRAVITY

FIELD OF THE INVENTION

The invention relates to methods and an apparatus for determining battery parameters for the purpose of battery analysis and charging and, more particularly, to methods and an apparatus for determining the specific gravity of a battery electrolyte.

BACKGROUND OF THE INVENTION

It is often desirable to determine a battery's state of charge (SOC) for diagnostic functions and development of satisfactory charging regimes. One method for determining the SOC of a battery, such as a lead-acid battery, uses a measurement of the specific gravity of the battery's electrolyte. Because this method requires access to the battery's electrolyte, problems arise when used on sealed batteries.

Another method for determining the SOC of a battery, such as a lead-acid battery, uses a measurement of open circuit voltage (OCV) as a state of charge indicator. This method does not require access to the battery's electrolyte. Generally, the OCV refers to the potential difference across the battery terminals with no load on the battery. As the battery discharges, the potential difference between the terminals drops.

Conventional lead-acid battery analyzers measure the decrease in OCV from a full charge OCV to determine the battery's SOC. The OCV of the battery is also related to a specific gravity (SG) of the battery's electrolyte. Specific gravity of the battery refers to a ratio of the density of the battery's electrolyte to the density of water. For example, a flooded cell lead-acid battery with six cells and a full charge specific gravity of 1.28 typically has a full charge OCV of 12.7 volts (V).

Problems arise, however, because conventional methods and apparatus do not take into account recently introduced lead-acid batteries having a sulfuric acid electrolyte with a full charge specific gravity of 1.30. These higher specific gravity lead-acid batteries generally have a full charge OCV of 13 V. Because the conventional methods and apparatus measuring SOC cannot distinguish between the lower specific gravity batteries (1.28 SG) and the higher specific gravity batteries (1.30 SG), incorrect battery analysis and charging results when using the higher specific gravity batteries with conventional methods and apparatus.

Thus, there is a need to overcome these and other problems of the prior art and to provide better methodology and apparatus to distinguish higher specific gravity batteries from lower specific gravity batteries.

SUMMARY OF THE INVENTION

In accordance with various embodiments, there is a method of determining a specific gravity of a lead-acid battery. The method includes applying a current ramp to the battery while measuring a battery voltage and subsequently detecting gas points. A maximum measured voltage per cell is then calculated by dividing a maximum measured battery voltage by a number of cells of the battery. The specific gravity of the battery is determined when one or more gas points are detected, by comparing the maximum voltage per cell to an $SG_{Lim}$. The $SG_{Lim}$ is an upper limit of a maximum measured battery voltage per cell for a low specific gravity battery. The maximum voltage per cell being less than the $SG_{Lim}$ indicates a low specific gravity lead-acid battery.

In accordance with various embodiments, there is also an apparatus for determining a specific gravity of a battery. The apparatus includes a power supply and a controller that controls the power supply to apply a current ramp to the battery. The apparatus further includes a control relay electrically connected to the power supply and at least one sensor that detects a battery voltage response to the current ramp, the sensor being electrically connected to the control relay. The apparatus also includes a processor configured to compare a maximum battery voltage detected in the battery voltage response divided by a number of cells of the battery, to an $SG_{Lim}$. The $SG_{Lim}$ is the upper limit of a maximum measured battery voltage for a low specific gravity battery divided by the number of cells of the low specific gravity battery.

In another embodiment, there is a computer readable medium for determining a specific gravity of a battery. The computer readable medium includes program code for applying a current ramp to a battery comprising a number of cells and program code for measuring a battery voltage response and detecting gas points. The computer readable medium further includes program code for calculating a state of charge of the battery and a maximum voltage per cell of the battery, and program code for comparing a maximum battery voltage detected in the battery voltage response to the applied current ramp divided by the number of cells of the battery to an $SG_{Lim}$. The $SG_{Lim}$ is the upper limit of a maximum measured battery voltage of a low specific gravity battery divided by the number of cells of the low specific gravity battery.

In another embodiment, there is an automated battery charger including a power supply and a controller to cause the power supply to apply a current ramp to a test battery and to control charging of the test battery. The automated battery charger further includes a sensor to detect a test battery voltage and detect gas points in response to the current ramp and a computer to determine a specific gravity of the test battery based on a comparison of a maximum measured voltage per cell to an $SG_{Lim}$. The $SG_{Lim}$ represents a determination threshold between a higher specific gravity battery and a lower specific gravity battery. Charging of the test battery is based on the computer's determination of the specific gravity of the test battery.

Additional objects and advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
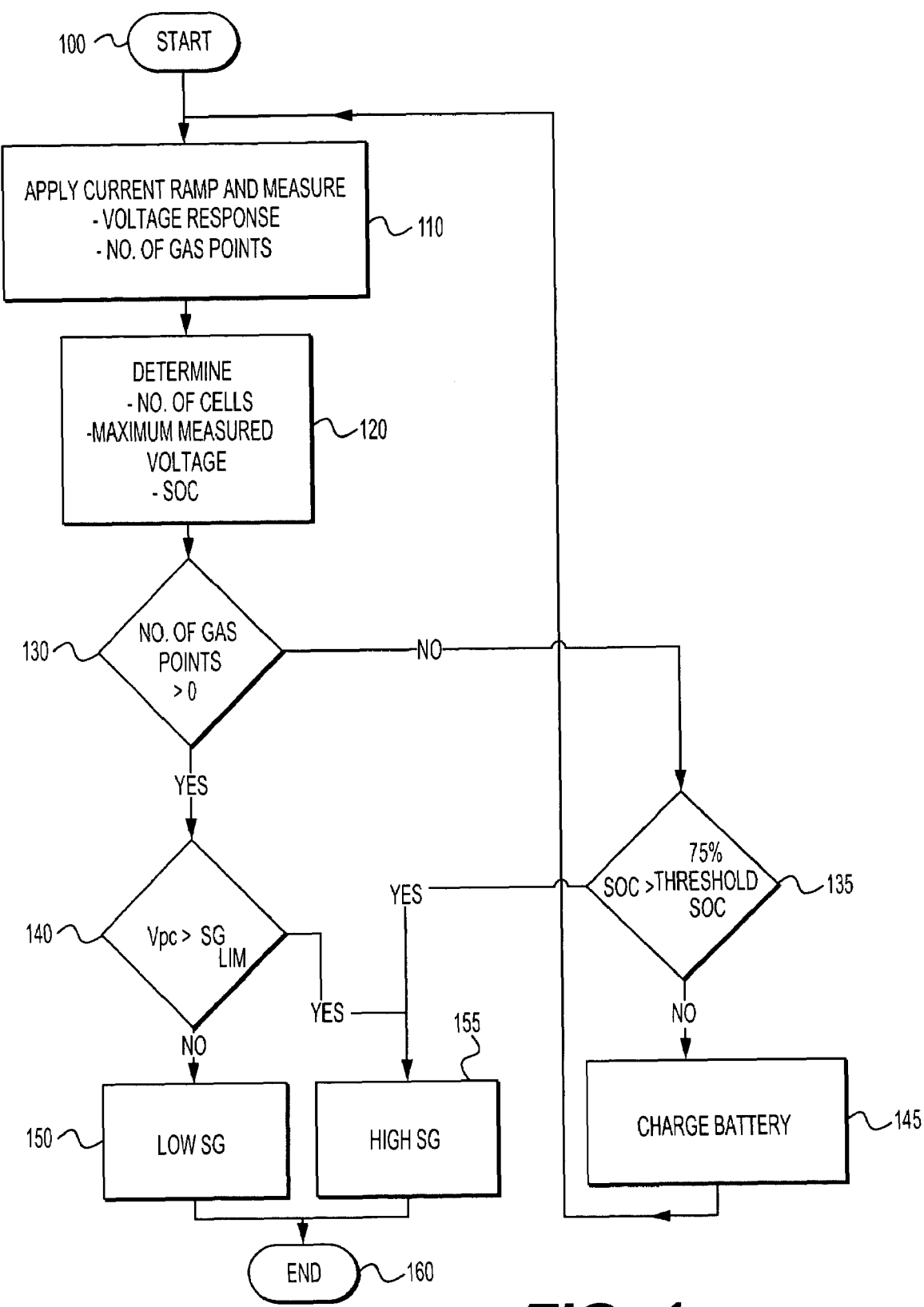
FIG. 1 depicts a flow chart of a method capable of determining the electrolyte specific gravity of a battery in accordance with an exemplary embodiment.
Figure 2:
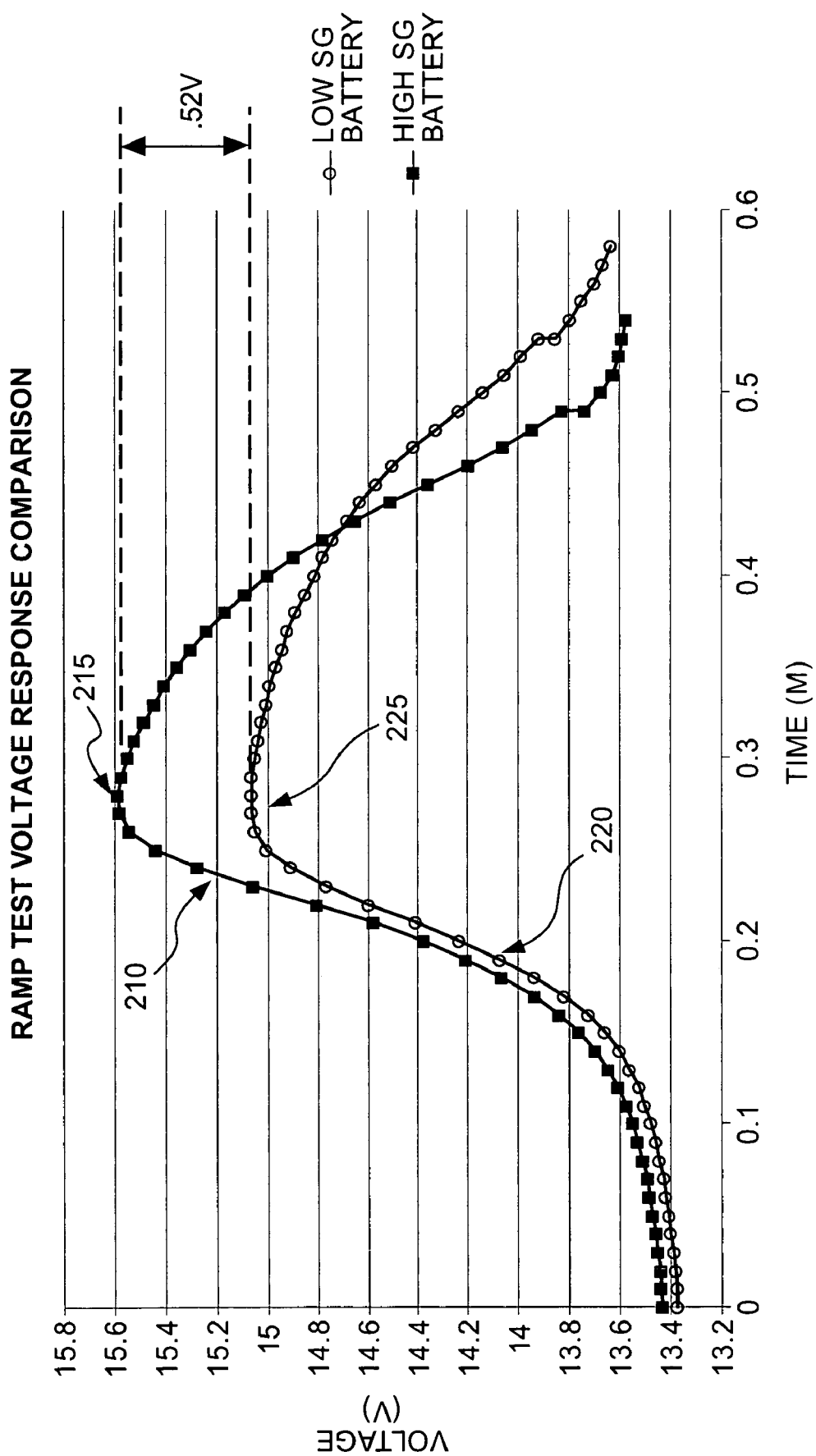
FIG. 2 depicts a graph that shows a voltage response of a higher SG battery and a lower SG battery in response to a ramp test in accordance with an exemplary embodiment.
Figure 3:
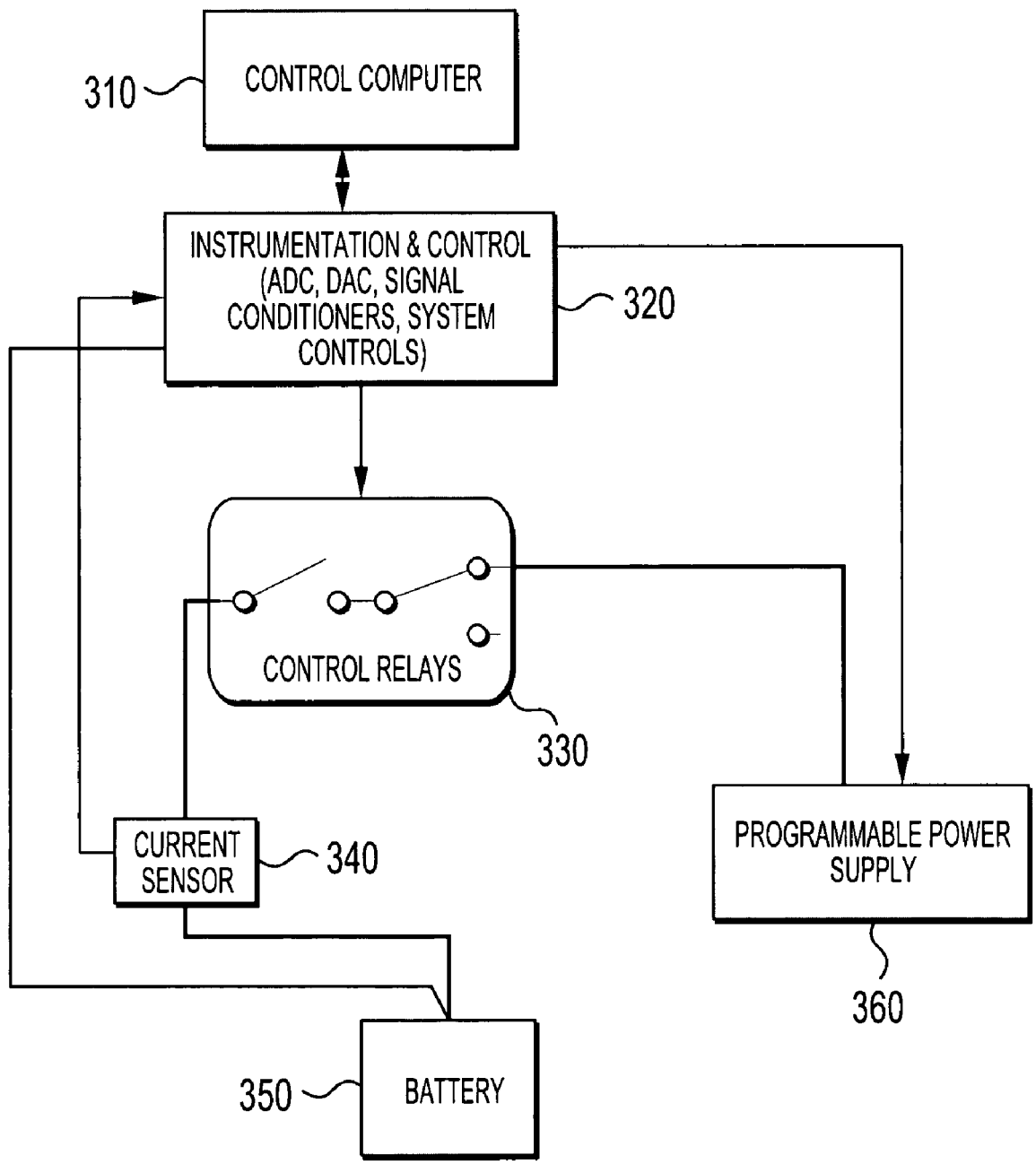
FIG. 3 depicts a block diagram of a system capable of determining the electrolyte specific gravity of a battery in accordance with an exemplary embodiment.

FIGS. 1–3 disclose, generally, apparatus and methods for determining a specific gravity of a battery's electrolyte.

FIG. 1 depicts an exemplary flow chart of a method 100 to determine a specific gravity of a battery. As used herein, the terms "specific gravity" and "battery specific gravity" refer to the specific gravity of the electrolyte of the battery. In 110, a current ramp is applied to the battery, for example, a lead-acid battery having a plurality of cells, while measuring battery voltage at the battery terminals. In various embodiments, the current ramp is linearly increased to a predetermined limit and then linearly decreased at a same slope until the current is zero. The number of gas points is also measured during application of the current ramp. A gas point occurs when the applied current causes hydrogen gas and oxygen gas to be generated from water in the electrolyte within a cell. These gasses can be detected using methods known to one of skill in the art.

In 120, several battery parameters can be determined in order to calculate a maximum voltage per cell ($V_{pc}$). A number of cells of the battery can be determined by various methods know to one of skill in the art. For example, the number of cells of the battery is generally provided by the battery specification. A maximum measured voltage of the battery in response to the current ramp of 110 can also be determined. The $V_{pc}$ can be calculated by dividing the maximum measured battery voltage by the number of cells of the battery.

An SOC can also be determined in 120 using algorithms known to one of skill in the art. For example, a single cell lead-acid battery has an OCV that varies from about 2.0 to about 2.2 V as its SOC increases from 0% to 100%. The SOC can be determined by the following equation:

$$SOC = (OCV_m - OCV_{min}) \times 100 / (OCV_{max} - OCV_{min}),$$

where $OCV_m$ is the measured OCV, $OCV_{min}$ is the OCV at 0% SOC, and $OCV_{max}$ is the OCV at 100% SOC.

Because the battery's SG is unknown at this point, a default algorithm using a battery having either the higher SG or the lower SG can be used. The specific algorithm can reflect the typical battery type tested by a user. For example, a lower SG (1.28) flooded cell lead-acid battery having 6 cells, has an $OCV_{min}$ of about 11.5 V and an $OCV_{max}$ of about 12.7 V.

In 130, the number of gas points determined in 110, affects the analytical methodology. If the number of gas points is greater than 0, the maximum voltage per cell ($V_{pc}$) can be compared to an $SG_{Lim}$. When distinguishing between a higher SG battery and a lower SG battery, $SG_{Lim}$ represents the determination threshold. For example, $SG_{Lim}$ is about 2.53 V, when distinguishing between a battery having an SG of 1.28 and a battery having an SG of 1.30. If $V_{pc} \leq SG_{Lim}$, the battery is determined to be the lower SG battery (1.28) as shown in 150. If $V_{pc} \leq SG_{Lim}$, the battery is determined to be the higher SG battery (1.30) as shown in 155.

If the number of gas points is not greater than zero in 130, then the SOC determined in 120 can be compared to an SOC threshold value as depicted in 135. The SOC threshold represents the maximum state of charge for which gas points should not be detectable. For example, when testing batteries having a rated capacity of 25–100 amp hours (Ah), the SOC threshold value can equal 75% SOC. If the SOC determined in 120 is greater than the 75% SOC threshold, the battery is determined to be a higher value SG battery (1.30) in 155.

If the SOC determined in 120 is less than 75% of the SOC threshold, the battery SG cannot be immediately determined. The battery is therefore charged for a predetermined amount of time to increase the SOC, as depicted in 145. The predetermined amount of time can be determined by one of skill in the art. After charging, the method is repeated from 110.

FIG. 2 depicts a voltage response of a lower specific gravity lead-acid battery 220 and a voltage response of a higher specific gravity lead-acid battery 210 to an applied current ramp. Both batteries were at equivalent states and conditions before testing, and were subjected to the same current ramp test. The applied current was initially 0 A, and was incremented linearly at a constant ramp until the test battery voltage measured 15V. At that point the applied current was decremented linearly at an equal but opposite slope until the applied current once again reached 0 A. In response to the current ramp, the lower specific gravity battery reached a voltage maximum 225 of about 15.1 V while the higher specific gravity battery reached a voltage maximum 215 of about 15.6 V. As shown in FIG. 2, the measured voltage of the higher specific gravity battery reached a higher maximum than the measured voltage of the lower specific gravity battery.

Using the above values, for example, the $SG_{Lim}$ can be calculated by first determining an optimal threshold that distinguishes between points 225 and 215, which are the maximum measured voltage during the ramp test, and dividing that value by the number of cells. In the embodiment that distinguishes between the lower SG battery and the higher SG battery depicted in FIG. 2, $SG_{Lim}$ is about 2.53V. In various embodiments, a value for $SG_{Lim}$ can be determined from results of a larger set of similar test results, to gain a better spread of data.

FIG. 3 depicts an exemplary configuration of a system 300 that can determine the specific gravity of a battery. In various embodiments, the exemplary system 300 includes various modules, such as a control computer 310, an instrumentation and control module 320, a control relay 330, a current sensor 340, and a power supply 360. Although depicted as separate modules, the system can be implemented in a single unit, such as, for example, the Honeywell TruCharge™ analyzer/charger. Also shown in FIG. 3 is a battery 350, such as a lead-acid battery. In various embodiments, system 300 can also include a display to indicate the determined specific gravity of battery 350.

In various embodiments, control computer 310 can include a set of specific gravity measurements algorithms. Control computer 310 can also include any software drivers that can be used to control other modules of the exemplary system.

Control computer 310 is connected to instrumentation and control module 320. Control computer 310 can be any suitable computer such as, for example, a personal computer with a data acquisition module installed therein. In various embodiments, instrumentation and control module 320 can include an analog-to-digital converter (ADC), a digital-to-analog converter (DAC), signal conditioners, and system controls. Instrumentation and control module 320 can include, for example, a National Instruments signal conditioning system. The ADC and DAC process information input into the instrumentation and control module 320 and coordinate with the system controls to operate the other modules in system 300. For example, the ADC, the DAC, and the system controls can control relay 330, current sensor 340, and/or power supply 360. In various embodiments, power supply 360 can be programmable. Power supply 360 can be, for example, a Hewlett-Packard model 6032 A power supply. Power supply 360, in conjunction with instrumentation and control module 320, can apply a current ramp, such as an increasing or decreasing current ramp of predetermined slopes, to battery 350. In various embodiments, power supply 360 and/or instrumentation and control module 320 can include the computer software that controls the slope of the current ramp.

In various embodiments, control relay 330 is used to connect battery 350 whose specific gravity is to be determined, to power supply 360. For example, instrumentation and control module 320 can control control relay 330 by applying a contact closure control signal over a line 317 to switch battery 350 in and out of the circuit. When relay 315 is open, battery 350 is taken out of the circuit and no current is applied. When relay 315 is closed, battery 350 is in the circuit and a current can be applied. Current sensor 340, such as a current shunt, can be placed in a series with battery 350. An exemplary current sensor 340 can include, for example, an amp meter comprised of a 50-amp/50-millivolt shunt, and can be connected to a channel of the ADC. Other suitable techniques can also be used to measure current, such as a Hall effect device. Measured parameters, such as voltage and current, both analog quantities, can be converted to digital form by ADC in instrumentation and control module 320. The digital data of these parameters can be supplied to control computer 310. Current sensor 340 can be used to measure the amount of current going to, or coming from, battery 350.

Referring to FIG. 3, various embodiments can further include an automated system for charging a battery. Automated system 300 can include a power supply 360 and a controller 320. Controller 320 can cause power supply 360 to apply a current ramp test to a battery 350. Controller 320 can further control charging of battery 350 after a specific gravity and an SOC of the battery are determined. System 300 can further include a sensor 340 to detect a battery voltage and to detect gas points during the current ramp test. Sensor 340 can send data to controller 360 to be converted from analog to digital before being sent to a computer 310.

Computer 310 compares a maximum measured voltage per cell ($V_{pc}$) to an $SG_{Lim}$. For example, when distinguishing between a higher SG lead-acid battery and a lower SG lead-acid battery, $SG_{Lim}$ is about 2.53 V. If $V_{pc} \leq SG_{Lim}$, the battery is determined to be the lower SG battery (1.28). If $V_{pc} \leq SG_{Lim}$, the battery is determined to be the higher SG battery (1.30). Once the specific gravity of battery 350 is determined, charging of battery 350 can be accomplished based on the battery's specific gravity.

Various embodiments include a computer readable medium. For example, embodiments can include a power supply control program that can control the amount of current supplied to the battery. The power supply control program can be stored in at least one of control computer 310, instrumentation and control module 320, and power supply 360. The power supply control program can include subroutines that direct power supply 360 to apply an increasing and/or decreasing current ramp to battery 350.

Various embodiments can include a current sensor program code that can control current sensor 340 to measure the voltage response of battery 350 when the current ramp is applied to battery 350. The current sensor control program can be stored in at least one of control computer 310, instrumentation and control module 320, and current sensor 340. The current sensor control program can direct current sensor 340 to measure the response voltage of battery 350 when the power supply control program directs power supply 360 to apply an increasing current ramp to battery 350. The current sensor control program can further direct current sensor 340 to measure the response voltage of battery 350 when the power supply control program directs power supply 360 to apply a decreasing current ramp to battery 350.

Various embodiments include a processor control program that can determine a specific gravity of battery 350. The processor control program can be stored in at least one of control computer 310 and instrumentation and control module 320. The processor control program can receive information from instrumentation and control 320, power supply 360, and current sensor 340. The received information can be processed and compared to a generated graph, such as, for example, FIG. 2, or used in the mathematical algorithm to determine the specific gravity of the electrolyte in battery 350. Various embodiments can further include a processor control program that indicates the specific gravity of battery 350.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of determining a specific gravity of a lead-acid battery the method comprising:
   applying a current ramp to the battery while measuring a battery voltage of the lead-acid battery, observing if gas points occur while the current ramp is applied, and detecting the number of gas points that occur;
   calculating a maximum voltage per cell by dividing a maximum of the measured battery voltage measured in response to the current ramp by a known number of cells of the lead-acid battery; and
   determining if the specific gravity of the lead-acid battery is low or high when one or more gas points are detected by comparing the maximum voltage per cell to an $SG_{Lim}$,
   wherein the $SG_{Lim}$ is an upper limit of a maximum measured battery voltage divided by the known number of cells.

2. The method of claim 1, wherein the maximum voltage per cell being less than the $SG_{Lim}$ indicates that the lead-acid battery is a lower specific gravity lead-acid battery, and wherein the maximum voltage per cell being greater than the $SG_{Lim}$ indicates that the lead-acid battery is a higher specific gravity lead-acid battery.

3. The method of claim 1, further comprising determining if the specific gravity of the lead-acid battery is low or high when no gas points are detected by comparing a calculated state of charge of the battery to a state of charge threshold value.

4. The method of claim 3, wherein the state of charge threshold value is a 75% state of charge threshold.

5. The method of claim 1, wherein applying the current ramp comprises:
applying a linearly increasing current until the battery voltage reaches a predetermined limit; and
applying a linearly decreasing current after reaching the predetermined limit.

6. The method of claim 4, wherein a slope of the linearly increasing current is approximately equal to an absolute value of a slope of the linearly decreasing current.

7. The method of claim 1, wherein $SG_{Lim}$ is about 2.53 volts.

8. The method of claim 4, wherein the state of charge threshold represents a maximum state of charge for which gas points should not be detectable.

9. The method of claim 3 further comprising, determining the battery to be a high specific gravity battery, where no gas points are detected and where the calculated state of charge exceeds the state of charge threshold value.

10. The method of claim 3, further comprising charging the battery when no gas points are detected.

11. The method of claim 10, further comprising repeating the method for determining the specific gravity beginning at a step of applying the current ramp.

12. An apparatus for determining a specific gravity of a battery comprising:
a power supply;
a controller that controls the power supply to apply a current ramp to the battery;
a control relay electrically connected to the power supply and the battery;
at least one sensor that detects a battery voltage response of the battery to the current ramp, the at least one sensor electrically connected to the control relay; and
a processor configured to compare a maximum battery voltage detected in the battery voltage response divided by a known number of cells of the battery, to an $SG_{Lim}$, where the $SG_{Lim}$ is an upper limit of a maximum measured battery voltage divided by the known number of cells; wherein said processor determines if the battery is a higher specific gravity battery or a lower specific gravity battery.

13. The apparatus of claim 12, wherein the processor is further configured to determine the number of gas points of the battery.

14. The apparatus of claim 12, wherein the processor is further configured to compare a state of charge of the battery to a 75% state of charge threshold.

15. The apparatus of claim 12, further comprising a display for indicating a specific gravity of the battery.

16. The apparatus of claim 12, wherein the current ramp comprises:
a linearly increasing current to a predetermined limit; and
a linearly decreasing current after reaching the predetermined limit.

17. A method for determining a specific gravity of a battery, comprising:
controlling the amount of current supplied to the battery comprising a known number of cells using a power supply control program;
measuring a battery voltage response of the battery by controlling a current sensor with a current sensor control program;
calculating a state of charge of the battery and a maximum voltage per cell of the battery using a processor control program;
comparing a maximum battery voltage detected in the battery voltage response divided by the known number of cells of the battery, to an $SG_{Lim}$ using the processor control program, where the $SG_{Lim}$ is an upper limit of a maximum measured battery voltage divided by the number of cells; and
determining a specific gravity of the battery by distinguishing between a higher specific gravity battery and a lower specific gravity battery using the processor control program.

18. The method of claim 17, further comprising comparing the state of charge of the battery to a 75% state of charge threshold using said processor control program.

19. The method of claim 17, further comprising:
linearly increasing current to a predetermined limit using the power supply control program; and
linearly decreasing current after reaching the predetermined limit using the power supply control program.

20. The method of claim 17, further comprising charging the battery based on the determined specific gravity of the battery using the processor control program.

21. An automated battery charger comprising:
a power supply;
a controller to cause the power supply to apply a current ramp to a test battery including a sulfuric acid electrolyte and having a full charge specific gravity of about 1.30 and to control charging of the test battery;
a sensor to detect a voltage of the test battery and gas points in response to the current ramp;
a computer to determine a low or high specific gravity of the test battery based on a comparison of a maximum measured voltage per cell to an $SG_{Lim}$, wherein the $SG_{Lim}$ represents a determination threshold between a high specific gravity battery and a low specific gravity battery; and
an automated system for charging the test battery, wherein charging of the test battery is based on the computer's determination of the specific gravity of the test battery.

22. The automated battery charger of claim 21, wherein the $SG_{Lim}$ is determined by dividing an upper limit of a maximum measured battery voltage divided by a known number of cells of the test battery.

* * * * *